United States Patent
Tjandra

(10) Patent No.: US 10,020,186 B2
(45) Date of Patent: Jul. 10, 2018

(54) SILICON GERMANIUM SELECTIVE OXIDATION PROCESS

(71) Applicant: Applied Materials, Inc., Santa Clara, CA (US)

(72) Inventor: Agus Sofian Tjandra, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/414,500

(22) Filed: Jan. 24, 2017

(65) Prior Publication Data
US 2018/0033615 A1    Feb. 1, 2018

Related U.S. Application Data

(60) Provisional application No. 62/368,671, filed on Jul. 29, 2016.

(51) Int. Cl.
*H01L 21/02*    (2006.01)
*H01L 21/321*    (2006.01)

(52) U.S. Cl.
CPC .... *H01L 21/02236* (2013.01); *H01L 21/0223* (2013.01); *H01L 21/02252* (2013.01); *H01L 21/02255* (2013.01); *H01L 21/02323* (2013.01); *H01L 21/02507* (2013.01); *H01L 21/32105* (2013.01)

(58) Field of Classification Search
CPC ......... H01L 21/02255; H01L 21/02252; H01L 21/02532; H01L 21/02236; H01L 21/02381; H01L 21/0245; H01L 21/02323; H01L 21/3165; H01L 21/32105; H01L 21/76855–21/76856; H01L 21/76888; H01L 21/0223; H01L 29/66795; H01L 29/785

See application file for complete search history.

(56) References Cited

U.S. PATENT DOCUMENTS

| | | | |
|---|---|---|---|
| 4,409,260 A | 10/1983 | Pastor et al. | |
| 9,425,313 B1* | 8/2016 | Chen | H01L 29/7849 |
| 9,595,449 B1* | 3/2017 | Jagannathan | H01L 21/3105 |
| 2002/0197806 A1* | 12/2002 | Furukawa | H01L 21/2254 438/305 |
| 2006/0110934 A1* | 5/2006 | Fukuchi | H01J 37/32192 438/778 |
| 2008/0073691 A1* | 3/2008 | Konno | H01L 29/513 257/315 |
| 2008/0315206 A1* | 12/2008 | Herner | H01L 27/115 257/66 |
| 2009/0035952 A1* | 2/2009 | Chua | H01L 21/0223 438/788 |

(Continued)

*Primary Examiner* — Marvin Payen
*Assistant Examiner* — Jeremy Joy
(74) *Attorney, Agent, or Firm* — Patterson + Sheridan LLP

(57) ABSTRACT

Implementations described herein relate to selective oxidation processes for semiconductor device manufacturing. In one implementation, the process includes delivering a substrate having a semiconductor device comprising at least a silicon material and a silicon germanium material formed thereon to a process chamber. Process variables are determined based upon the germanium concentration of the silicon germanium material and a desired oxide thickness and a selective oxidation process is performed utilizing the determined process variables.

18 Claims, 6 Drawing Sheets

(56) References Cited

U.S. PATENT DOCUMENTS

| | | | |
|---|---|---|---|
| 2010/0297854 A1* | 11/2010 | Ramamurthy | H01J 37/3244 438/788 |
| 2014/0034632 A1* | 2/2014 | Pan | H01L 21/02238 219/520 |
| 2014/0319462 A1* | 10/2014 | Huang | H01L 29/785 257/18 |
| 2014/0353731 A1* | 12/2014 | Colinge | H01L 29/7843 257/288 |
| 2015/0102411 A1* | 4/2015 | Ching | H01L 21/76205 257/347 |
| 2015/0144999 A1* | 5/2015 | Ching | H01L 29/66795 257/190 |
| 2015/0145002 A1* | 5/2015 | Lee | H01L 27/0922 257/192 |
| 2016/0093726 A1* | 3/2016 | Ching | H01L 29/785 257/192 |
| 2016/0181414 A1* | 6/2016 | Huang | H01L 29/785 257/401 |
| 2016/0308048 A1* | 10/2016 | Ching | H01L 29/7848 |
| 2017/0194207 A1* | 7/2017 | Basker | H01L 21/823431 |
| 2017/0301767 A1* | 10/2017 | Niimi | H01L 29/45 |
| 2017/0317109 A1* | 11/2017 | Wang | H01L 27/1211 |

* cited by examiner

SILICON GERMANIUM SELECTIVE OXIDATION PROCESS

CROSS-REFERENCE TO RELATED APPLICATIONS

This application claims benefit of U.S. Provisional Patent Application No. 62/368,671, filed Jul. 29, 2016, the entirety of which is herein incorporated by reference.

BACKGROUND

Field

Implementations of the present disclosure generally relate to semiconductor manufacturing and more specifically to processes for selective oxidation of silicon germanium materials.

Description of the Related Art

In the manufacture of semiconductor devices, the oxidation of silicon and various other materials is frequently utilized. For example, a gate oxide layer is ordinarily situated over a substrate containing a source region, a drain region, and an intervening silicon or polysilicon region. Metal contacts are deposited over the source and drain regions, and a conductive layer is deposited over the gate oxide. When a voltage is applied across the gate oxide, electrical characteristics of a channel (i.e. the region between the source and drain) region change. The change either allows or prevents the flow of electrons through the channel between the source and drain regions. Accordingly, the gate oxide enables switching of the device. Oxide materials are also utilized in other semiconductor device components for electrical insulation and material separation and/or isolation, among others.

Selective oxidation of a desired device material preferentially to other materials has been shown to provide various benefits for semiconductor manufacturing. However, conventional oxygen rich oxidation processes are susceptible to oxidizing all oxidizable materials present in a semiconductor device with little or no selectivity. For example, conventional oxidation processes may oxidize undesired materials, such as metals and barrier layers, in addition to desired materials, such as a gate structure. FIGS. 1A-1C (Prior Art) depict oxidation rates of silicon for conventional dry oxidation, wet oxidation, and steam oxidation processes, respectively.

Subjecting a device to heat under an atmosphere of dilute steam rich in hydrogen gas ($H_2$) at low pressure can selectively oxidize silicon containing materials without oxidizing metals or barrier layers. However, operating a hydrogen combustion chamber at high temperature and pressure often results in hydrogen gas attacking barrier, hard mask, and other layers undesirable for oxidation which may result in forming unwanted metal silicide layers with higher resistivity. Moreover, in advanced semiconductor devices, such as horizontal gate all around (HGAA) devices which utilize compound semiconductor materials (i.e. silicon germanium), selective oxidation is increasingly important to enable desirable oxide growth rates while maintaining suitable selectivity.

Accordingly, what are needed in the art are processes for selectively oxidizing various materials of semiconductor devices.

SUMMARY

In one embodiment, a selective oxidation method is provided. The method includes pressurizing a process chamber to greater than 500 Torr and heating a process region of the process chamber to a temperature less than 700° C. Reactive species comprising hydrogen and oxygen are generated in the process region, and a substrate comprising at least a silicon material and a silicon germanium material is exposed to the reactive species to selectively oxidize the silicon germanium material preferentially to the silicon material.

In another embodiment, a selective oxidation method is provided. The method includes pressurizing the process chamber between 7 Torr and 550 Torr and heating a process region of the process chamber to a temperature less than 700° C. but greater than 575° C. Reactive species comprising hydrogen and oxygen are generated in the process region and a substrate comprising at least a silicon material and a silicon germanium material are exposed to the reactive species to selectively oxidize the silicon germanium material preferentially to the silicon material.

In yet another embodiment, a selective oxidation method is provided. The method includes pressurizing the process chamber to greater than 500 Torr and heating a process region of the process chamber to a temperature less than 700° C. Reactive species comprising hydrogen and oxygen are generated in the process region. The oxygen to hydrogen ratio is between 19:1 and 1:9 and hydroxyl radicals are generated remotely from the process chamber and delivered to the process region. A substrate comprising at least a silicon material and a silicon germanium material are exposed to the reactive species to selectively oxidize the silicon germanium material preferentially to the silicon material. The silicon germanium is oxidized at a rate of between 2 times and 16 times greater than an oxidation rate of the silicon material.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

Figure 1C:
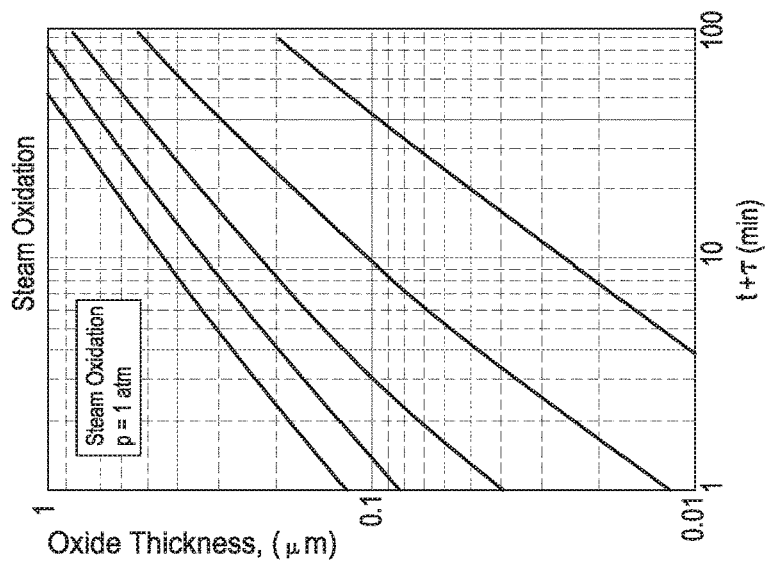
FIG. 1C (Prior Art) illustrates a graph of oxidation rates for silicon under steam conditions.
Figure 1B:
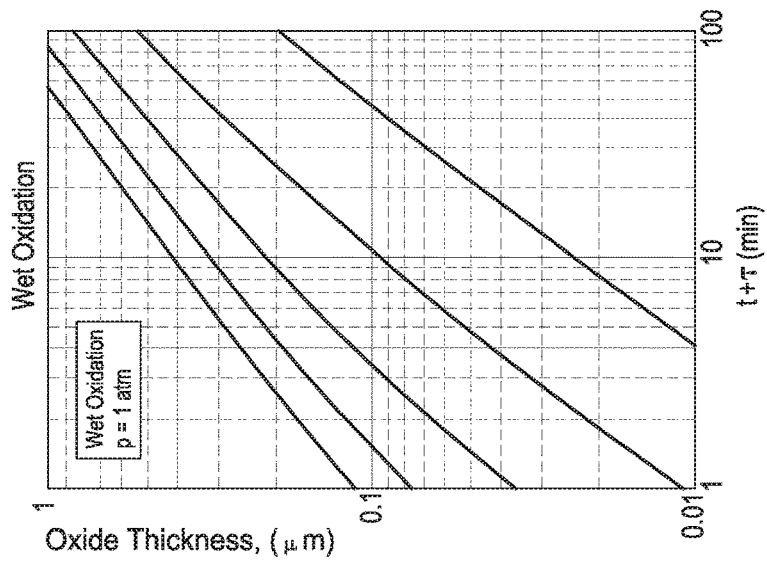
FIG. 1B (Prior Art) illustrates a graph of oxidation rates for silicon under wet conditions.
Figure 1A:
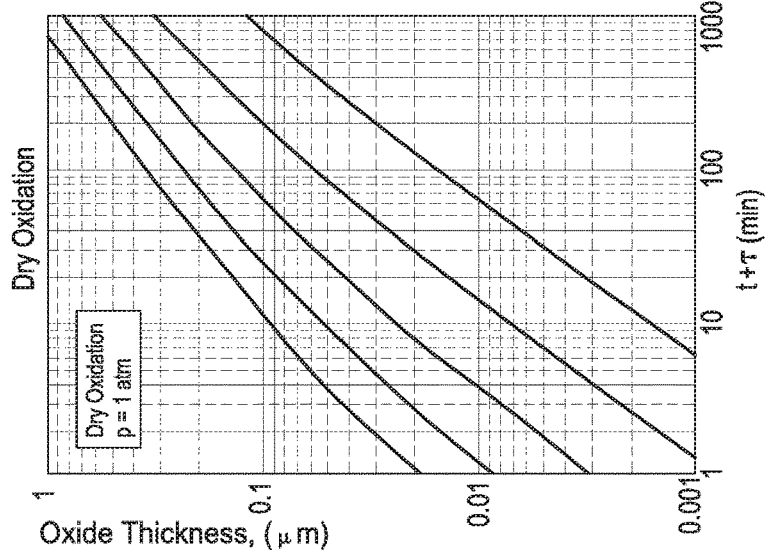
FIG. 1A (Prior Art) illustrates a graph of oxidation rates for silicon under dry conditions.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments described herein relate to selective oxidation processes for semiconductor device manufacturing. In one embodiment, the process includes delivering a substrate having a semiconductor device comprising at least a silicon material and a silicon germanium material formed thereon to a process chamber. Process variables are determined based upon the germanium concentration of the silicon germanium material and a desired oxide thickness and a selective oxidation process is performed utilizing the determined process variables.

Figure 2:
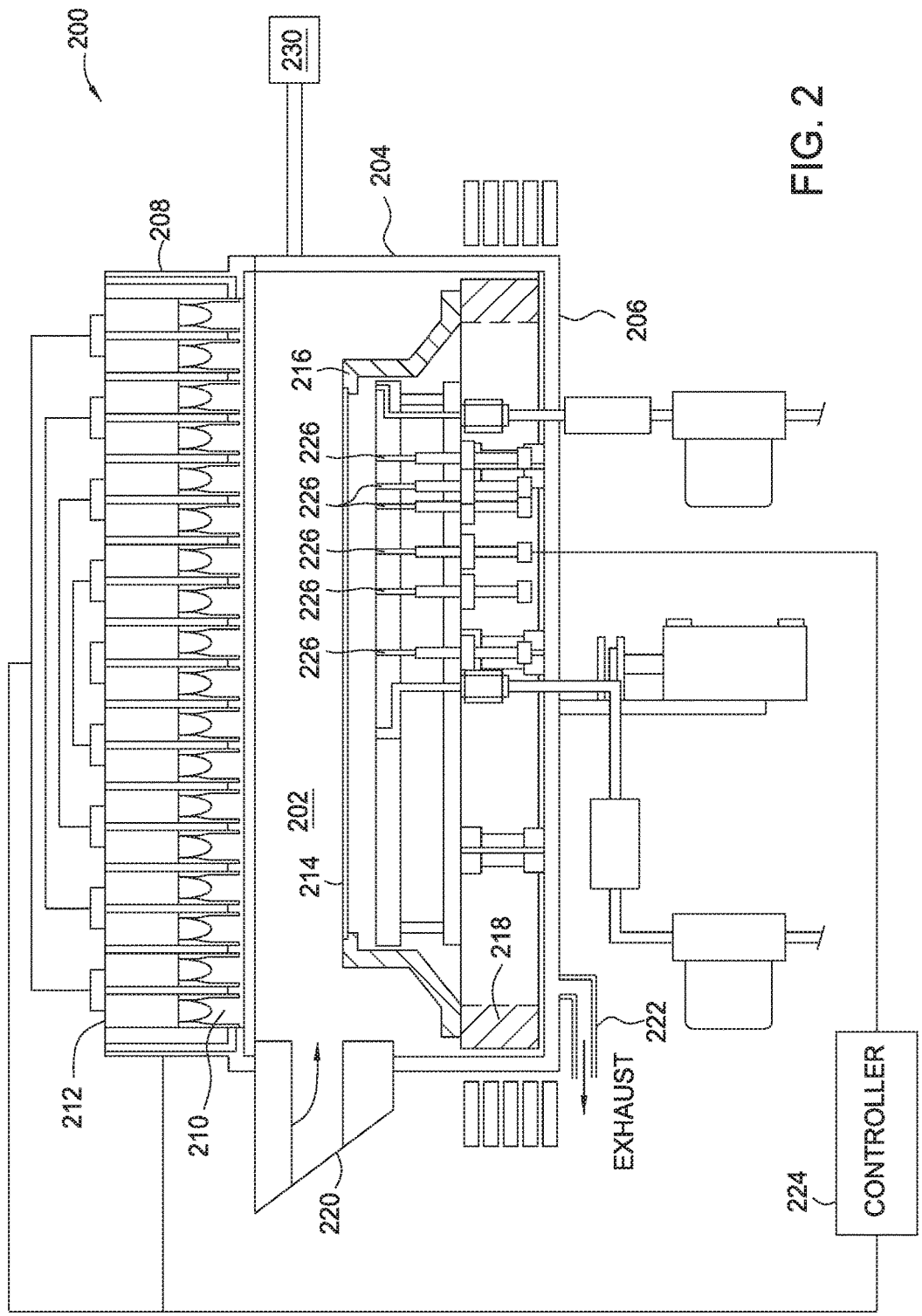
FIG. 2 illustrates a rapid thermal heating apparatus suitable for performing the implementations described herein.

FIG. 2 illustrates a rapid thermal heating apparatus 200 that can be utilized to perform the implementations described herein. More specifically, the apparatus 200 may be utilized to perform selective oxidation processes. Such apparatus is available from Applied Materials, Inc., Santa Clara, Calif. and other apparatus suitably configured may be utilized in accordance with the embodiments describe herein. The apparatus 200 includes a process chamber 202 that may be evacuated or filled with process gas precursors, radicals and/or ions thereof. The apparatus also includes a side wall 204 and bottom enclosure 206. The sidewall 204 is sealed against a lamp assembly 208 from which radiant energy is directed into the chamber 202. The lamp assembly 208 includes a plurality of lamps 201, such as tungsten halogen lamps, for example Sylvania EYT lamps. Each lamp 210 is mounted into a light pipe 212 which may be made of stainless steel, brass, aluminum, or other suitable metal.

A substrate 214 is supported within the process chamber 202 by a support ring 216 that contacts the edge of the substrate 214. The support ring 216 is made of a material capable of withstanding high temperatures, such as silicon carbide, without imparting impurities to the substrate 214. The support ring 216 may be mounted on a rotation cylinder 218. In one implementation, the rotation cylinder 218 is a quartz rotation cylinder capable of rotating the support ring 216 and substrate 214 thereon. In one implementation, rotation of the substrate 214 promotes uniform temperature distribution and reduces temperature non-uniformities across the substrate 214. In another implementation, rotation of the substrate 214 improves exposure of the substrate 214 to reactive species (i.e. radicals/ions) within the chamber 202.

Process gases may be admitted to the chamber through a first portal 220 and exhaust evacuated through a second portal 222. In some implementations multiple gas feed and exhaust portals may be used. A temperature controller 224 receives measurements from pyrometers 226 and adjusts power to the lamps 210 to achieve uniform or substantially uniform heat distribution throughout the chamber 202.

In addition to heating the substrate 214, heat generated by the lamp assembly 208 is utilized for thermal combustion of the process gas or gases within the chamber 202. Suitable process gases include one or more of a carrier gas and a reactive species. Examples of a carrier gas include inert gases, such as argon, nitrogen, and helium or the like. In one implementation, the carrier gas is utilized to carry the reactive species to the process chamber 202. Examples of reactive species include the radicals and/or ions of hydrogen, oxygen, and combinations thereof. Other process gases, such as nitrous oxide, may also be utilized as precursors for oxygen reactive species generation. Similarly, ammonia or the like may be utilized as a precursor for hydrogen reactive species generation. As utilized herein, reactive species also include vapors of the process gases. For example, if hydrogen and oxygen are exposed to sufficient input energy, steam may be generated in the process chamber 202.

In certain implementations, the apparatus 200 includes a remote plasma source 230 which is in fluid communication with the process chamber 202. In one implementation, the remote plasma source 230 is utilized to generate reactive species remotely from the process chamber 202 and deliver the reactive species to the process chamber 202. The remote plasma source 230 may be utilized either alone or in combination with thermal combustion processes to generate the reactive species. In one implementation, the remote plasma source 230 is utilized to supplement a thermal combustion process with additional reactive species when temperatures in the process chamber 202 are not high enough to reliably generate reactive species alone.

Figure 3:
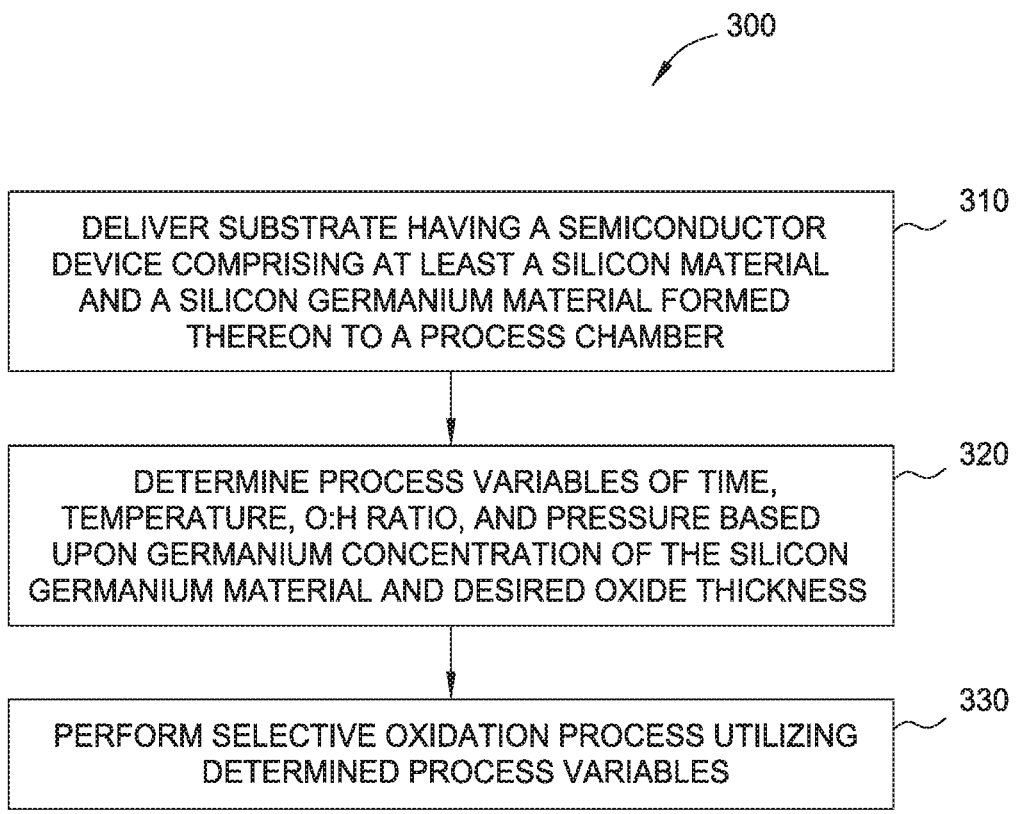
FIG. 3 illustrates operations of a selective oxidation method according to implementations described herein.

FIG. 3 illustrates operations of a selective oxidation method 300. Operation 310 includes delivering a substrate having a semiconductor device comprising at least a silicon material and a silicon germanium material formed thereon to a process chamber, such as the process apparatus 200. It is contemplated that the semiconductor device is any device formed on a substrate which utilizes silicon and silicon germanium for one or more components of the device. For example, one implementation of a semiconductor device which may benefit from the implementations described herein is a horizontal gate all around (HGAA) fin field effect transistor (FinFET). In this implementation, a channel of the HGAA FinFET may be a first material, such as silicon germanium, and the substrate or the gate electrode may be a second material, such as silicon. A more detailed description of such a device may be had with reference to FIG. 4B.

At operation 320, process variables of time, temperature, O:H ratio, and pressure are determined based, at least partially, upon the germanium concentration of the silicon germanium and a desired oxide thickness. It is contemplated that the oxide thickness is application dependent, for example, the desired oxide thickness may be different if oxides formed utilizing the method 300 are intended to be a gate oxide or an oxide for device isolation. For example, an oxide layer for device isolation may have a thickness between about 100 Å and about 300 Å, such as between about 150 Å and about 200 Å. In another example, an oxide layer for gate oxide applications may have a thickness of less than about 100 Å, such as less than about 50 Å, for example, less than about 25 Å. It is contemplated that the thicknesses of isolation oxide layer and gate oxide layers will be influenced by the type and size of semiconductor device utilizing the oxide layer.

Similarly, the germanium concentration of a silicon germanium material utilized in the semiconductor device is influenced by the type of device and desired function of the silicon germanium material. In one implementation, silicon germanium is utilized as a channel material and/or gate material in a HGAA FinFET device. In this implementation, the germanium concentration may be influenced by electrical implementation of the silicon germanium material exhibited by implementation in advanced node devices, such as sub-10 nm node devices. Further, the germanium concentration may be influenced by the oxide growth rate and ability of the silicon germanium material to be preferentially oxidized relative to other materials, such as silicon, present in the device. In another implementation, silicon germanium is oxidized and the resulting oxide layer is utilized in a device isolation implementation. In this implementation, the germanium concentration is similarly influenced by the oxide growth rate and ability of the silicon germanium material to be preferentially oxidized relative to other materials, such as silicon, present in the device.

Figure 4A:
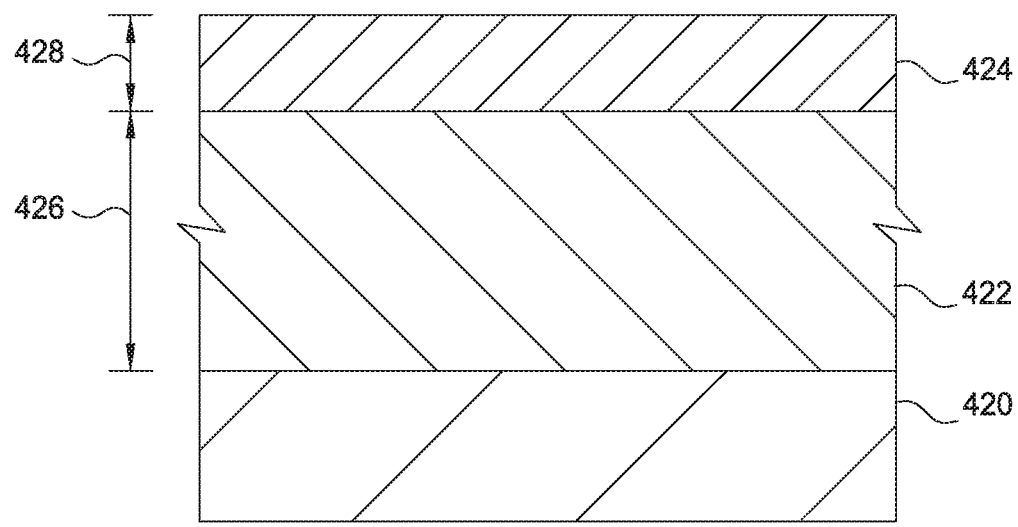
FIG. 4A illustrates a schematic, cross-sectional view of a portion of a semiconductor device fabricated utilizing the implementations described herein.

FIG. 4A illustrates a schematic cross-sectional view of a portion of a semiconductor device. The illustrated implementation depicts a first material layer 420, a second material layer 422, and a third material layer 424. In one implementation, the first material layer 420 is a silicon material. Examples of the silicon material include silicon, doped silicon, polysilicon, doped polysilicon, amorphous silicon, dopes amorphous silicon, microcrystalline silicon, dopes microcrystalline silicon, silicon dioxide, and combinations thereof. The silicon material may form a substrate, gate electrode, or other device structure depending upon the desired implementation. The second material 422 is a silicon germanium material. The silicon germanium material may form a channel or other device structure depending upon the desired implementation.

The third material layer 424 is an oxide material, such as germanium oxide. It is contemplated that the first material layer 420 and the second material layer 422 may be simultaneously exposed to oxidative materials and the silicon germanium of the second material layer 422 is preferentially oxidized relative to the silicon of the first material layer 420. More specifically, it is contemplated that the germanium of the silicon germanium second material layer 422 is oxidized preferentially to the silicon of the silicon germanium material or other silicon material, such as the first material layer 420.

In one implementation, FIG. 4A illustrates a portion of a sub-10 nm device structure. In this implementation, the first material layer 420 is a silicon material and the second material layer 422 is a silicon germanium material having a germanium concentration of between about 30% and about 80%, such as between about 40% and about 50%. The illustrated implementation may be utilized for a device isolation application and a thickness 426 of the second material layer 422 may be between about 500 Å and about 1500 Å. Selective oxidation of the second material layer 422 results in the third material layer 424 having a thickness 428 of between about 150 Å and about 200 Å, depending upon the process variables utilized during the selective oxidation process.

Referring back to FIG. 3, time, temperature, O:H ratio, and pressure process variables are determined for the selective oxidation process. In one implementation, a silicon germanium material having 40% germanium is selectively oxidized for 60 seconds at 700° C. in a process chamber maintained at 7 Torr in an environment having a 19:1 O:H ratio. In another implementation, a silicon germanium material having 40% germanium is selectively oxidized for 240 seconds at 700° C. in a process chamber maintained at 300 Torr in an environment having a 3:7 O:H ratio. In yet another implementation, a silicon germanium material having 40% germanium is selectively oxidized for 240 seconds at 700° C. in a process chamber maintained at 530 Torr in an environment having a 1:9 O:H ratio.

More generally, silicon germanium oxidation preferential to silicon oxidation is obtained by utilization of higher pressures above about 20 Torr at or below 700° C. For example, pressures of greater than about 300 Torr or greater than about 500 Torr may be utilized. Temperatures as low as about 575° C. may be utilized to facilitate steam generation for performing the selective oxidation process. While lower temperatures typically degrade selective oxidation processes, utilizing lower temperatures enables selective oxidation of an increased number of devices by not exceeding the thermal budgets of such materials. Moreover, temperatures at or below about 700° C. reduce the probability of silicon germanium lattice defect formation as it is believed that germanium migration out of the lattice structure is reduced or eliminated at such temperatures.

The above referenced implementations are believed to achieve between about 2× and about 16× growth rate enhancement of silicon germanium relative to silicon. The improved growth rate and selectivity are achieved predominantly through the utilization of higher pressures, for example, between about 7 Torr and about 550 Torr. As a result of the pressures utilized, it is believed that hydroxyl radicals predominate which provides additional moisture for oxidation relative to conventional selective oxidation processes. It is also contemplated that above about 500 Torr, the rate at which radical oxidation of silicon germanium occurs is increased relative to conventional selective oxidation processes. Thus, improved silicon germanium to silicon oxidation selectivity may be achieved in an efficient and cost effective manner.

At operation 330, the selective oxidation process may be performed utilizing the determined process variables. While the above referenced implementations are directed to thermal selective oxidation processes, other oxidation schemes may be utilized. In certain embodiments, hydrogen radicals and/or ions, oxygen radicals and/or ions, and hydroxyl radicals and/or hydroxide ions may be generated by radical oxidation processes or remote plasma oxidations processes. In other implementations, selective thermal oxidation may be utilized in combination with either radical oxidation processes or remote plasma oxidation processes.

Figure 4B:
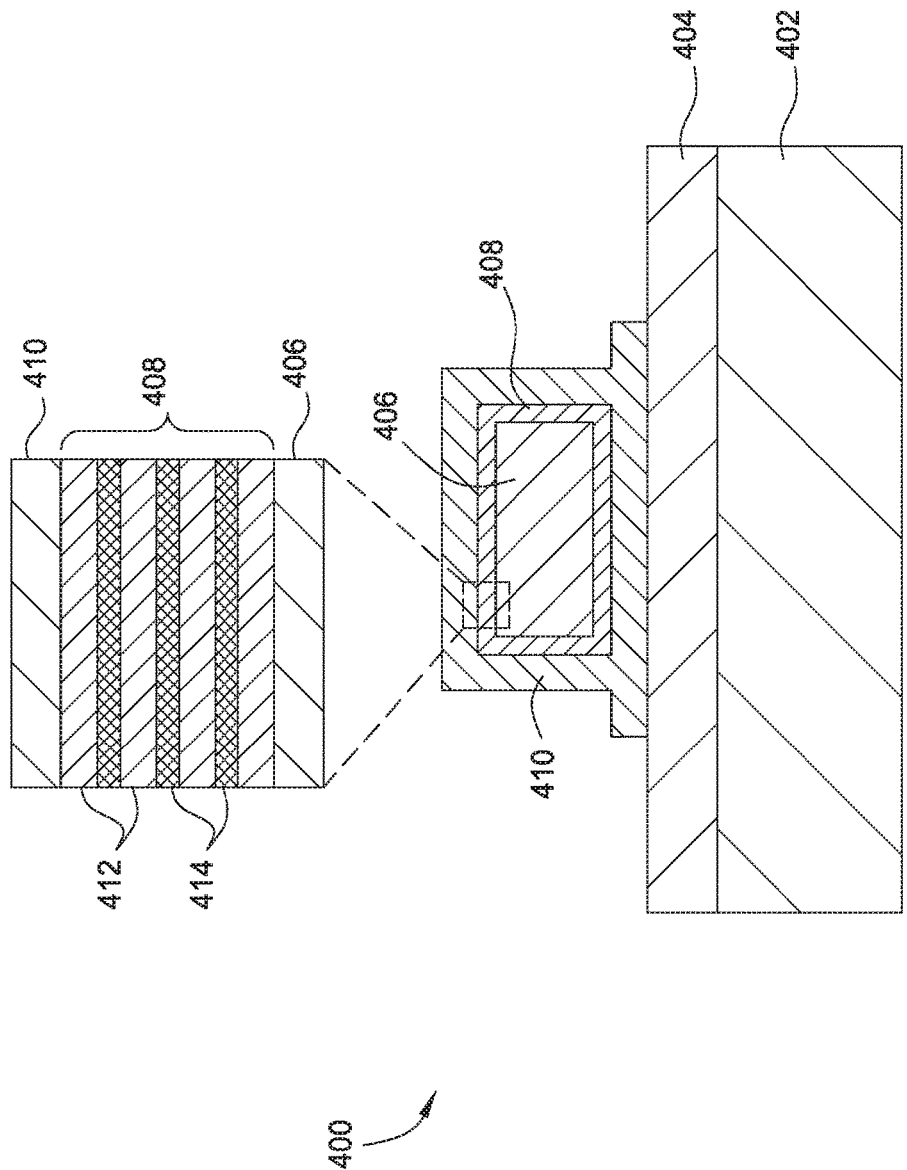
FIG. 4B illustrates schematic, cross-sectional view of a horizontal gate all around semiconductor device fabricated utilizing the implementations described herein.

FIG. 4B illustrates schematic, cross-sectional view of an HGAA semiconductor device 400 fabricated utilizing the embodiments described herein. The illustrated device 400 includes a substrate 402 and a buried oxide layer 404 disposed on the substrate 402. The device 400 also includes a channel 406, a gate oxide 408 surrounding the channel 406, and a gate 410 surrounding the gate oxide 406. In one implementation, the method 300 is utilized to selectively oxidize either a portion of the channel 406 or a gate oxide precursor material. In this implementation, the channel 406 and/or the gate oxide precursor material are formed from a silicon germanium material. It is contemplated that the silicon germanium material selectively oxidized to form the gate oxide 408 is preferentially oxidized relative to silicon materials exposed to the same selective oxidation process.

In the illustrated implementation, a silicon germanium material having 40% germanium is selectively oxidized for 240 seconds at 700° C. in a process chamber maintained at 530 Torr in an environment having a 1:9 O:H ratio to form the gate oxide 408. The resulting gate oxide 408 includes alternating layers of germanium oxide 412 and crystalline germanium 414. Under the process conditions described above, it is believed that hydroxyl radicals predominantly influence the germanium oxidation rate which results in oxidation of the germanium at a rate greater than a rate at which germanium atoms diffuse out of the silicon germanium crystal lattice structure. As a result, the ultimately formed gate oxide 408 includes oxide layers with embedded crystalline germanium layers. In certain implementations, the oxide layers with embedded crystalline germanium layers is considered a germanium oxide/crystalline germanium superlattice structure. It is believe that the embedded crystalline germanium layers within the germanium oxide may provide for improved electron mobility and various benefits may be derived therefrom.

Figure 5:
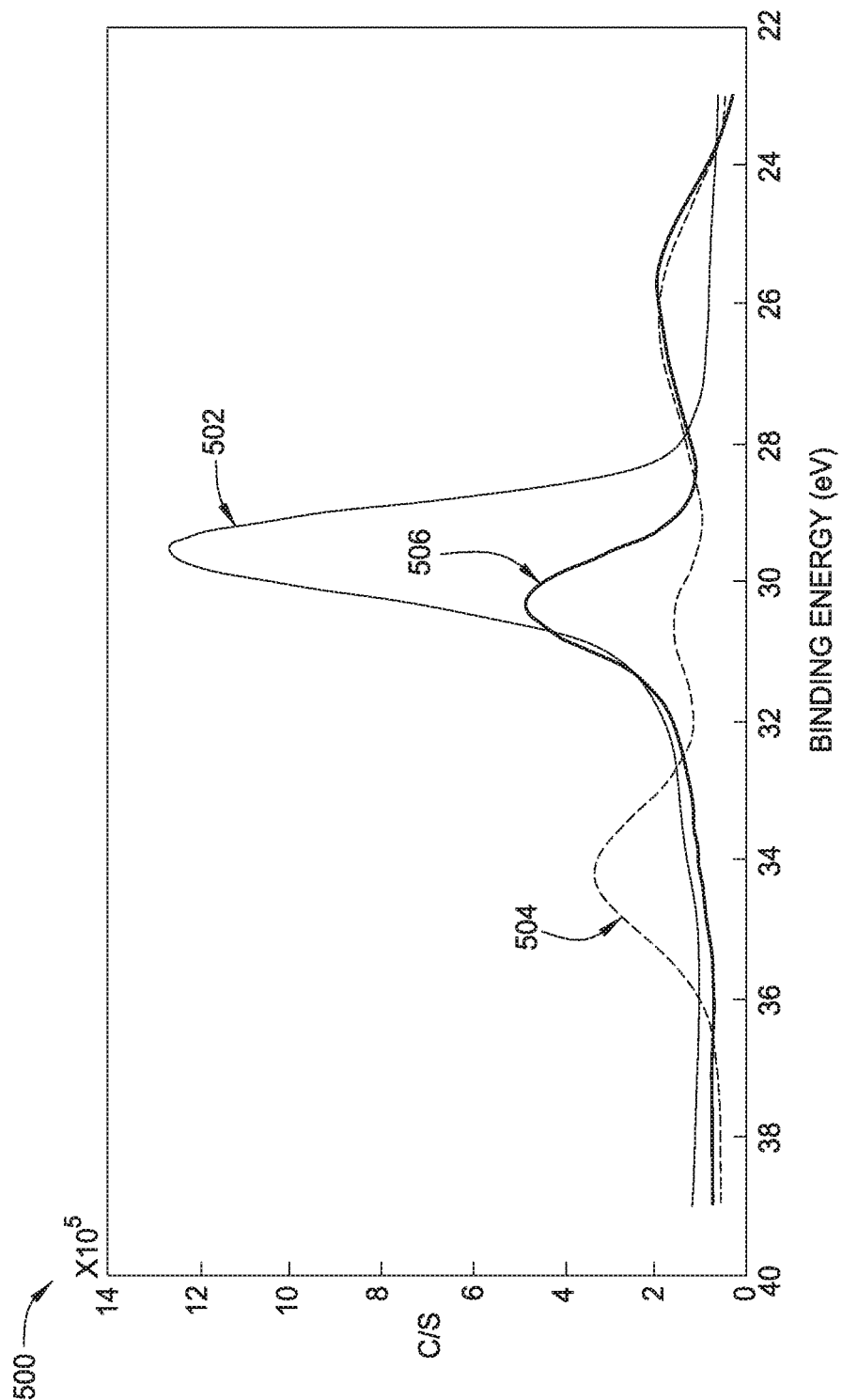
FIG. 5 illustrates x-ray photoelectron spectroscopy data illustrating oxide materials formed according to the implementations described herein.

FIG. 5 illustrates x-ray photoelectron spectroscopy (XPS) data 500 illustrating oxide materials formed according to the embodiments described herein. Data 502 is representative of a reference metallic silicon germanium material. Data 504 is representative of a germanium oxide grown on silicon germanium at 700° C. in a 3:7 O:H ratio environment having a pressure of 300 Torr. Peaks of data 504 characterize formation of a germanium oxide material. Data 506 is representative of a germanium oxide grown on silicon germanium at 700° C. in a 1:9 O:H ratio environment having a pressure of 530 Torr. Peaks of data 506 characterize formation of a germanium oxide material and crystalline germanium material. Thus, data 506 is indicative of a germanium oxide/crystalline germanium superlattice structure similar to the gate oxide 408 described with regard to FIG. 4B.

In summation, implementations described herein provide for improved selective oxidation processes. More specifically, improved oxide growth rates and oxidation selectivity for silicon germanium relative to silicon may be achieved utilizing the implementations described herein. In addition, improved germanium oxide materials and germanium oxide/crystalline germanium supperlattice structures may be achieved. It is contemplated that the processes and material structures described herein may provide various advantages upon implementation in advanced technology nodes to facilitate economical and reliable semiconductor device fabrication.

While the foregoing is directed to implementations of the present disclosure, other and further implementations of the disclosure may be devised without departing from the basic scope thereof, and the scope thereof is determined by the claims that follow.

What is claimed is:

1. A selective oxidation method, comprising:
pressurizing a process chamber to greater than about 500 Torr;
heating a process region of the process chamber to a temperature less than about 700° C.;
generating reactive species comprising hydrogen and oxygen in the process region; and
exposing a substrate comprising at least a silicon material and a silicon germanium material to the reactive species to selectively oxidize the silicon germanium material preferentially to the silicon material, wherein the selectively oxidizing the silicon germanium comprises forming a germanium oxide/crystalline germanium superlattice structure.

2. The method of claim 1, wherein the silicon material and the silicon germanium material are simultaneously exposed to the reactive species.

3. The method of claim 2, wherein the silicon germanium material is selectively oxidized at a rate of between 2 times and 16 times greater than an oxidation rate of the silicon material.

4. The method of claim 1, wherein the reactive species are hydroxyl radicals.

5. The method of claim 1, wherein the reactive species are hydroxide ions.

6. The method of claim 1, wherein the reactive species are hydrogen and oxygen radicals.

7. The method of claim 1, wherein the reactive species are hydrogen and oxygen ions.

8. The method of claim 1, wherein a ratio of oxygen to hydrogen is between 19:1 and 1:9.

9. The method of claim 1, further comprising:
generating hydroxyl radicals remotely from the process chamber and delivering the hydroxyl radicals to the process region.

10. The method of claim 1, further comprising:
generating hydrogen and oxygen radicals remotely from the process chamber and delivering the hydrogen and oxygen radicals to the process region.

11. A selective oxidation method, comprising:
pressurizing a process chamber between 7 Torr and 550 Torr;
heating a process region of the process chamber to a temperature less than about 700° C. but greater than about 575° C.;
generating reactive species comprising hydrogen and oxygen in the process region; and
exposing a substrate comprising at least a silicon material and a silicon germanium material to the reactive species to selectively oxidize the silicon germanium material preferentially to the silicon material, wherein the selectively oxidizing the silicon germanium comprises forming a germanium oxide/crystalline germanium superlattice structure.

12. The method of claim 11, wherein the silicon material and the silicon germanium material are simultaneously exposed to the reactive species.

13. The method of claim 12, wherein the silicon germanium material is selectively oxidized at a rate between 2 times and 16 times greater than an oxidation rate of the silicon material.

14. The method of claim 11, wherein the reactive species are hydroxyl radicals.

15. The method of claim 11, wherein a ratio of oxygen to hydrogen is between 19:1 and 1:9.

16. The method of claim 11, further comprising:
generating hydroxyl radicals remotely from the process chamber and delivering the hydroxyl radicals to the process region.

17. A selective oxidation method, comprising:
pressurizing a process chamber to greater than about 500 Torr;
heating a process region of the process chamber to a temperature less than about 700° C.;
generating reactive species comprising hydrogen and oxygen in the process region, wherein a ratio of oxygen to hydrogen is between 19:1 and 1:9;
generating hydroxyl radicals remotely from the process chamber and delivering the hydroxyl radicals to the process region; and
exposing a substrate comprising at least a silicon material and a silicon germanium material to the reactive species to selectively oxidize the silicon germanium material preferentially to the silicon material, wherein the silicon germanium is oxidized at a rate of between 2 times and 16 times greater than an oxidation rate of the silicon material, and wherein the selectively oxidizing the silicon germanium comprises forming a germanium oxide/crystalline germanium superlattice structure.

18. The method of claim 17, wherein the silicon material and the silicon germanium material are simultaneously exposed to the reactive species and hydroxyl radicals.

* * * * *